(12) United States Patent
Kondo et al.

(10) Patent No.: US 8,102,888 B2
(45) Date of Patent: Jan. 24, 2012

(54) SEMICONDUCTOR LASER DEVICE AND DRIVING METHOD OF THE SAME

(75) Inventors: Nobuyuki Kondo, Tokyo (JP); Chikara Amano, Tokyo (JP)

(73) Assignee: NTT Electronics Corporation, Tokyo (JP)

( * ) Notice: Subject to any disclaimer, the term of this patent is extended or adjusted under 35 U.S.C. 154(b) by 105 days.

(21) Appl. No.: 12/442,726

(22) PCT Filed: Aug. 29, 2007

(86) PCT No.: PCT/JP2007/066780
§ 371 (c)(1),
(2), (4) Date: Mar. 25, 2009

(87) PCT Pub. No.: WO2008/050537
PCT Pub. Date: May 2, 2008

(65) Prior Publication Data
US 2009/0316742 A1  Dec. 24, 2009

(30) Foreign Application Priority Data
Oct. 20, 2006 (JP) .................. 2006-285795

(51) Int. Cl.
*H01S 3/04* (2006.01)
(52) U.S. Cl. ........................................................ 372/34
(58) Field of Classification Search .................... 372/35, 372/36, 20
See application file for complete search history.

(56) References Cited

U.S. PATENT DOCUMENTS

| | | | | |
|---|---|---|---|---|
| 5,265,115 A | * | 11/1993 | Amano | 372/75 |
| 5,546,220 A | * | 8/1996 | Endo et al. | 359/332 |
| 5,644,584 A | * | 7/1997 | Nam et al. | 372/20 |
| 5,690,915 A | * | 11/1997 | Eteve et al. | 424/60 |
| 5,870,417 A | * | 2/1999 | Verdiell et al. | 372/32 |

(Continued)

FOREIGN PATENT DOCUMENTS

| | | |
|---|---|---|
| JP | 06-188503 | 7/1994 |
| JP | 2000-031603 | 1/2000 |
| JP | 2002-329925 | 11/2002 |
| JP | 2003-332680 | 11/2003 |

OTHER PUBLICATIONS

Peterman, et al., "Noise and Distortion Characteristics of Semiconductor Lasers in Optical Fiber Communication Systems", IEEE Journal of Quantum Electronics, vol. QE-18, No. 4, 1982.

(Continued)

*Primary Examiner* — Jessica Stultz
*Assistant Examiner* — Tuan Nguyen
(74) *Attorney, Agent, or Firm* — Ohlandt, Greeley, Ruggiero & Perle, L.L.P.

(57) ABSTRACT

A semiconductor laser device according to the present invention outputs light while periodically varying the temperature of a semiconductor laser, an optical waveguide, or a diffraction grating, outputs light while causing the optical waveguide or the diffraction grating to mechanically and periodically vary, or causes return light, which varies periodically or non-periodically, to be incident on the semiconductor laser. Since the periodical fluctuation is applied to the temperature of the semiconductor laser, the optical waveguide, or diffraction grating, the periodical mechanical variation is applied to the optical waveguide or the diffraction grating, or the return light is caused to be incident on the semiconductor laser, the semiconductor laser carries out a multimode oscillation from a low output to a high output without shifting between a single mode oscillation and a multimode oscillation. Accordingly, the present invention can provide a semiconductor laser device having IL characteristics in which a current is proportional to a light output and a driving method thereof.

4 Claims, 5 Drawing Sheets

U.S. PATENT DOCUMENTS

| | | | | |
|---|---|---|---|---|
| 5,898,718 | A * | 4/1999 | Mohatt et al. | 372/22 |
| 6,021,141 | A * | 2/2000 | Nam et al. | 372/20 |
| 6,298,075 | B1 * | 10/2001 | Kitaoka et al. | 372/33 |
| 6,320,888 | B1 * | 11/2001 | Tanaka et al. | 372/32 |
| 6,323,990 | B1 * | 11/2001 | Yamamoto et al. | 359/328 |
| 6,335,944 | B1 * | 1/2002 | Mugino et al. | 372/102 |
| 6,590,915 | B1 * | 7/2003 | Kitaoka et al. | 372/38.02 |
| 6,665,321 | B1 * | 12/2003 | Sochava et al. | 372/20 |
| 7,119,324 | B2 * | 10/2006 | Voigt | 250/227.14 |
| 7,295,582 | B2 * | 11/2007 | McDonald et al. | 372/20 |
| 7,386,021 | B2 * | 6/2008 | Kashyap | 372/34 |
| 2002/0117678 | A1 | 8/2002 | Ohkubo et al. | |
| 2002/0163948 | A1 * | 11/2002 | Yoshida et al. | 372/45 |
| 2005/0123012 | A1 | 6/2005 | Hayamizu et al. | |

OTHER PUBLICATIONS

Achtenhagen, et al. L-I Characteristics of Fiber Bragg Grating Stabilized 980-nm Pump Lasers, IEEE Photonics Technology Letters, vol. 13, No. 5, 2001.

* cited by examiner

PRIOR ART

FIG. 8

PRIOR ART

FIG. 9

SEMICONDUCTOR LASER DEVICE AND DRIVING METHOD OF THE SAME

CROSS-REFERENCE TO PRIOR APPLICATION

This is the U.S. National Phase Application under 35 U.S.C. §371 of International Patent Application No. PCT/JP2007/066780, filed Aug. 29, 2007, which claims the benefit of Japanese Application No. 2006-285795, filed Oct. 20, 2006. The International Application was published in Japanese on May 2, 2008 as International Publication No. WO 2008/050537 under PCT Article 21(2). The afore-mentioned applications are hereby incorporated by reference in their entirety.

TECHNICAL FIELD

The present invention relates to a semiconductor laser device and a driving method thereof for generating light having a predetermined wavelength by reflecting a part of light having a predetermined wavelength of the light generated by a semiconductor laser to the semiconductor laser by a diffraction grating.

BACKGROUND OF THE INVENTION

It is known that the wavelength the light output from a semiconductor laser is greatly varied by a temperature change of the semiconductor laser. Accordingly, in the semiconductor laser device, the temperature of a semiconductor laser is maintained to a predetermined temperature by a peltier element and the like so that the wavelength of an output light is stabilized (refer to, for example, Japanese Patent Application Laid-Open Publication No. 06-188503).

Figure 7:
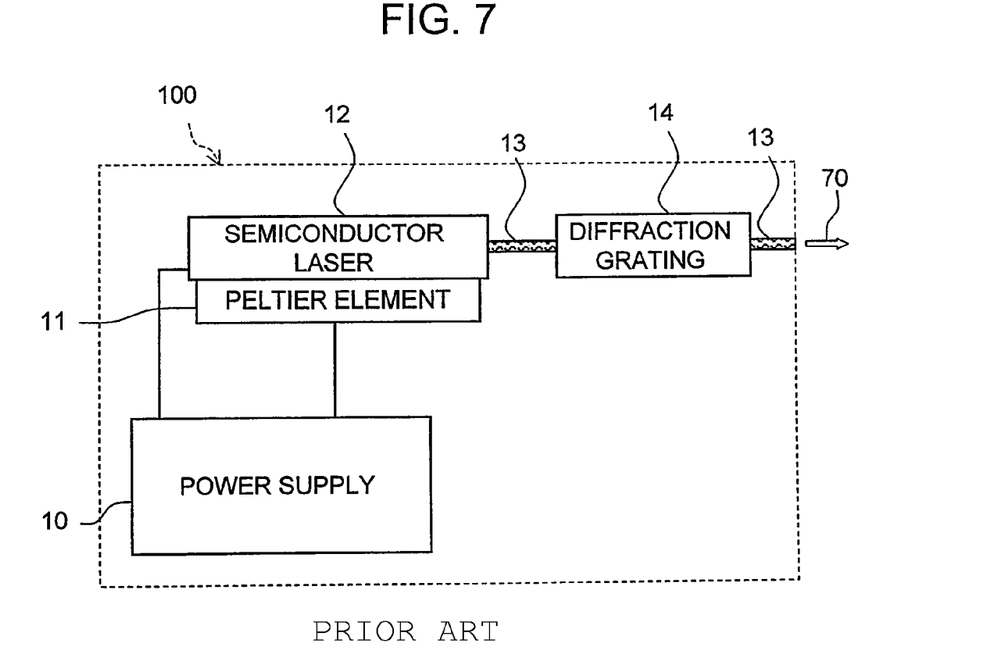
FIG. 7 is a block diagram showing an arrangement of a conventional semiconductor laser device.

FIG. 7 shows an arrangement of a conventional external resonator type semiconductor laser device 100. The semiconductor laser device 100 has a power supply 10, a peltier element 11, a semiconductor laser 12, an optical waveguide 13, and a diffraction grating 14. The semiconductor laser device 100 operates as described below. A current is supplied from the power supply 10 to the semiconductor laser 12 and light is generated. Further, a current is supplied from the power supply 10 to the peltier element 11 so that the semiconductor laser 12 is kept to a predetermined temperature. The generated light is coupled with the optical waveguide 13 from an emission end face of the semiconductor laser 12 and transferred to the diffraction grating 14. The diffraction grating 14 acting as an external resonator reflects a part of light having a predetermined wavelength and resonates only the wavelength. In the semiconductor laser device 100, the wavelength of the light generated by the semiconductor laser 12 is stabilized by the peltier element 11, a wavelength selectivity of output light 70 is enhanced by the diffraction grating 14.

Patent Document 1: Japanese Patent Application Laid-Open Publication No. 06-188503

Figure 8:
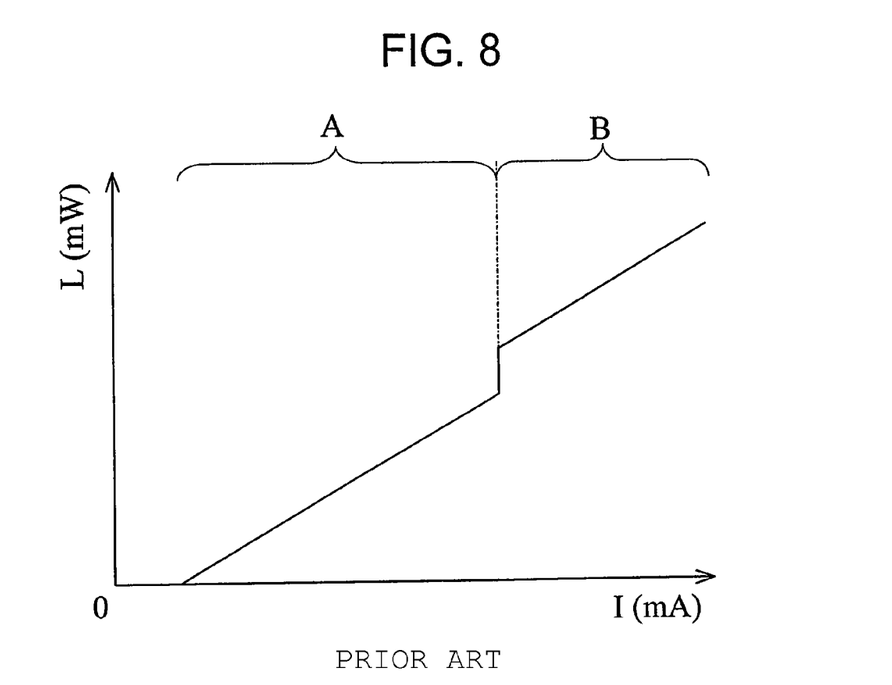
FIG. 8 shows IL characteristics of the conventional semiconductor laser device.

FIG. 8 shows a current-light output characteristics (IL characteristics) of the semiconductor laser device 100. Although a light output is increased by increasing a current, when the current exceeds a predetermined current value, the light output is made unstable (kink). It is assumed that this is because a longitudinal mode is made sensitive to disturbance as a result that the semiconductor laser is operated at the predetermined temperature as described above and thus the longitudinal mode shifts from single to multiple. In particular, since the kink of light intensity becomes noise in an image application device and the like, a problem arises in that it is difficult to make use of the semiconductor laser device 100 having the IL characteristics to the image application device and the like.

To solve the above problem, an object of the present invention is to provide a semiconductor laser device which operates stably in an entire current region and a driving method of the semiconductor laser device.

SUMMARY OF INVENTION

As a result of various experiments, the inventors have found that when a periodical fluctuation is applied to the temperature of a semiconductor laser, an optical waveguide, or a diffraction grating, when a periodical mechanical variation is applied to the optical waveguide or the diffraction grating, or when return light is caused to be incident on the semiconductor laser, the semiconductor laser carries out a multimode oscillation from a low output to a high output without shifting between a single mode oscillation and a multimode oscillation. The present invention has been achieved based on the discovery.

To achieve the above object, a semiconductor laser device according to the present invention outputs light while periodically varying the temperature of a semiconductor laser, an optical waveguide, or a diffraction grating or outputs light while mechanically and periodically varying the optical waveguide or the diffraction grating.

Specifically, the present invention is a driving method of a semiconductor laser device in which a semiconductor laser is optically coupled with a diffraction grating through an optical waveguide and a part of light having a predetermined wavelength of the light generated by the semiconductor laser is reflected to the semiconductor laser by the diffraction grating and the light having the predetermined wavelength is generated, the driving method being characterized in that light is output while applying a periodical fluctuation to the temperature of the semiconductor laser, the diffraction grating, or the optical waveguide, while applying a periodical mechanical variation to the optical waveguide or the diffraction grating or while causing return light whose light intensity or wavelength periodically or non-periodically varies to be incident on a portion of the semiconductor laser from which light is emitted.

A semiconductor laser device for outputting light while periodically varying a temperature in the driving method of the semiconductor laser device according to the present invention has a semiconductor laser for generating light, a diffraction grating optically coupled with the semiconductor laser for reflecting a part of light having a predetermined wavelength of the light from the semiconductor laser to the semiconductor laser, an optical waveguide for optically coupling between the semiconductor laser and the diffraction grating, and a temperature control means for applying a periodical fluctuation to the temperature of the semiconductor laser, the diffraction grating, or the optical waveguide.

It is preferable that the temperature control means be a peltier element connected to the semiconductor laser, the diffraction grating, or the optical waveguide for controlling the temperature of the semiconductor laser, the diffraction grating, or the optical waveguide. Since the peltier element requires neither a refrigerant nor a movable portion and can easily control a temperature, the structure thereof can be simplified.

In contrast, a semiconductor laser device which outputs light while applying a periodical mechanical variation in the driving method of the semiconductor laser device according to the present invention has a semiconductor laser for generating light, a diffraction grating optically coupled with the semiconductor laser for reflecting a part of light having a predetermined wavelength of the light from the semiconductor laser to the semiconductor laser, an optical waveguide for optically coupling between the semiconductor laser and the diffraction grating, and vibration means for applying a periodical mechanical variation to the optical waveguide or the diffraction grating.

It is preferable that the vibration means be a piezoelectric element connected to the optical waveguide or the diffraction grating. Since the piezoelectric element directly converts an electronic signal to vibration, the size thereof can be reduced and the number of vibrations can be easily controlled.

Further, a semiconductor laser device, in which return light that is periodically or non-periodically varies is incident on a semiconductor laser, in the driving method of the semiconductor laser device according to the present invention, has a semiconductor laser for generating light, a diffraction grating optically coupled with the semiconductor laser for reflecting a part of light having a predetermined wavelength of the light from the semiconductor laser to the semiconductor laser, an optical waveguide for optically coupling between the semiconductor laser and the diffraction grating, and return light control means for causing return light whose light intensity or wavelength periodically or non-periodically varies to be incident on a portion of the semiconductor laser from which light is emitted.

The return light control means may cause the return light to be directly incident on a portion of the semiconductor laser from which light is emitted or cause the return light to be incident on a portion of the semiconductor laser from which light is emitted through the diffraction grating.

Since the semiconductor laser carries out a multimode oscillation from a low output to a high output by outputting light by periodically varying a temperature, outputting light by applying a mechanical variation periodically or by radiating return light to the semiconductor laser, the kink of IL characteristics is removed because a longitudinal mode does not shift from a single mode to a multimode.

Accordingly, the present invention can provide a semiconductor laser device having IL characteristics in which a current is proportional to a light output and a driving method thereof.

Further, it is preferable that the periodical fluctuation of the temperature control means or the vibration means in the semiconductor laser device be in a sine wave state so that the cycle of the temperature fluctuation or the mechanical variation can be easily controlled.

Accordingly, the present invention can provide the semiconductor laser device having the IL characteristics in which a current is proportional to a light output and a driving method thereof.

Since a current to be supplied is proportional to a light output by driving the semiconductor laser device according to the present invention by the driving method according to the present invention, the semiconductor laser device according to the present invention can be used to a light source of an image application device and the like.

DETAIL DESCRIPTION OF THE INVENTION

Embodiments of the present invention will be explained referring to accompanying drawings. The embodiments explained below are examples of the present invention, and the present invention is not limited to the embodiments.

An embodiment is directed to a semiconductor laser device having a semiconductor laser which generates light, a diffraction grating which is optically coupled with the semiconductor laser and reflects a part of light having a predetermined wavelength of the light from the semiconductor laser to the semiconductor laser, an optical waveguide which optically couples between the semiconductor laser and the diffraction grating, and a temperature control means which applies a periodical fluctuation to the temperature of the semiconductor laser, the diffraction grating, or the optical waveguide.

Further, the temperature control means is a peltier element which is connected to the semiconductor laser, the diffraction grating, or the optical waveguide and controls the temperature of the semiconductor laser, the diffraction grating, or the optical waveguide.

Figure 1:
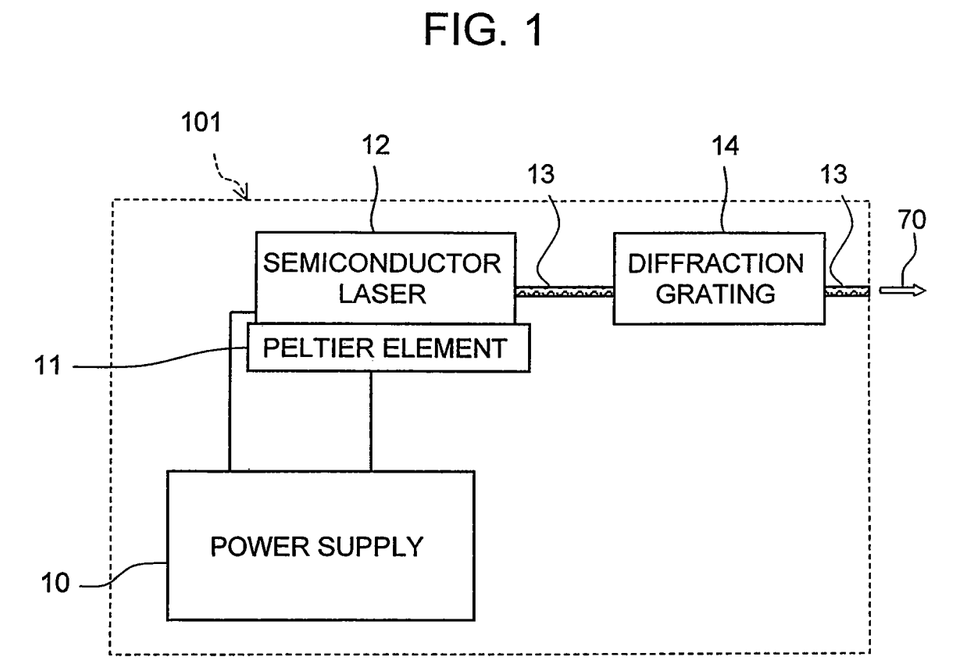
FIG. 1 is a block diagram showing an arrangement of a semiconductor laser device according to the present invention.

FIG. 1 is a block diagram showing an arrangement of the semiconductor laser device 101 of the embodiment. The semiconductor laser device 101 has a power supply 10, a peltier element 11, a semiconductor laser 12, an optical waveguide 13, and a diffraction grating 14.

The peltier element 11 is a device for cooling a surface by a current supplied thereto, and a surface temperature is changed by a current value. The surface temperature of the peltier element 11 may be changed by a voltage or an electric power. The semiconductor laser 12 generates light having a wavelength according to a band gap of an active layer by the current supplied thereto. The semiconductor laser 12 may generate light by the voltage or the electric power. The optical waveguide 13 confines the light therein and transfers it from one side to other side. An optical fiber and a planar optical waveguide can be exemplified as the optical waveguide 13. The diffraction grating 14 reflects light having a predetermined wavelength in an incident direction. A fiber Bragg grating (FBG) may be used as the diffraction grating 14.

The power supply 10 has a semiconductor laser drive unit for supplying a current for driving the semiconductor laser 12.

The semiconductor laser drive unit controls a current value for controlling the intensity of the light generated by the semiconductor laser 12. Note that the semiconductor laser drive unit may drive the semiconductor laser 12 by a voltage or an electric power. Further, the power supply 10 may have a circuit for monitoring the intensity of the light output from the semiconductor laser device 101 and feeding back a monitored result to the semiconductor laser drive unit.

Further, the power supply 10 has a peltier element drive unit for supplying a current for driving the peltier element 11. The peltier element drive unit has a function for periodically varying a current value to periodically vary the temperature of the peltier element 11. For example, the peltier element drive unit can supply a steady current Io added with a ±I sin ωt sine wave generated by a high frequency generator circuit to the peltier element 11. The peltier element drive unit may drive the peltier element 11 by a voltage or an electric power. Further, the power supply 10 may have a circuit for measuring the surface temperature of the semiconductor laser 12 and the peltier element 11 and feeding back a result of measurement to the peltier element drive unit.

The power supply 10 is connected to the peltier element 11 and the semiconductor laser 12. The peltier element 11 has a cooling surface connected to the semiconductor laser 12. The peltier element 11 may be in direct contact with the semiconductor laser 12 or may be connected to the semiconductor laser 12 through a substrate such as a metal sheet and the like. One end of the optical waveguide 13 is connected to an emission end face of the semiconductor laser 12. The diffraction grating 14 is connected to the other end of the optical waveguide 13.

A driving method of the semiconductor laser device 101, which optically couples the semiconductor laser 12 with the diffraction grating 14 through the optical waveguide 13 and generates the light having the predetermined wavelength by reflecting a part of light having the predetermined wavelength of the light generated by the semiconductor laser 12 to the semiconductor laser 12 by the diffraction grating 14, has a feature in that light is output while applying a periodical fluctuation to the temperature of the semiconductor laser 12.

The semiconductor laser device 101 operates as explained in the semiconductor laser device 100 of FIG. 7 and outputs output light 70. Further, since the peltier element drive unit of the power supply 10 supplies the current including the sine wave, the temperature of the cooling surface of the peltier element 11 is periodically varied, and the temperature of the semiconductor laser 12 is also periodically varied. Accordingly, the semiconductor laser 12 is oscillated in a multimode from a low output to a high output.

Figure 2:
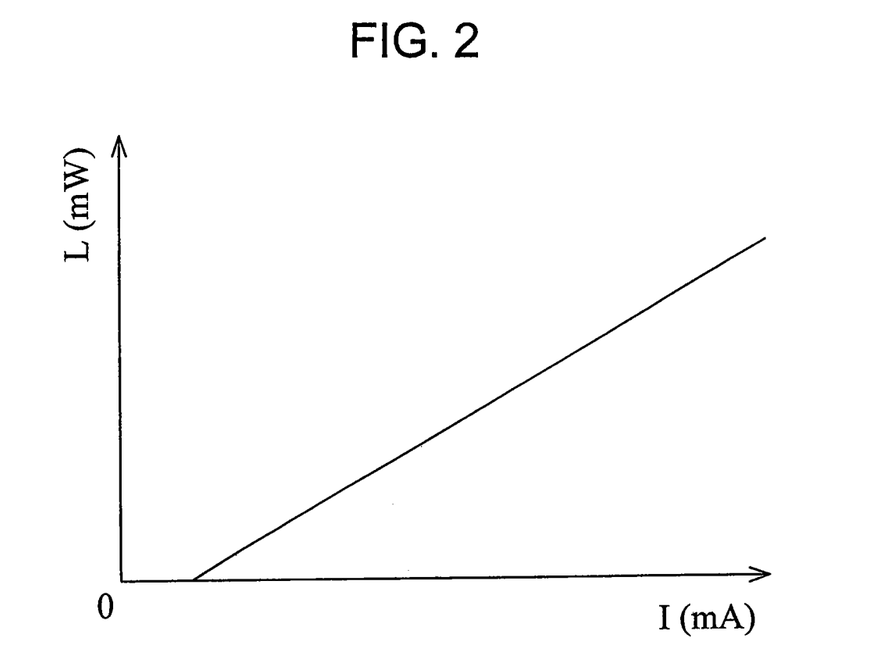
FIG. 2 shows IL characteristics of the semiconductor laser device according to the present invention.

FIG. 2 shows IL characteristics of the semiconductor laser device 101. As shown in FIG. 2, since no kink is generated in the IL characteristics, a current supplied to the semiconductor laser 12 is proportional to the light output of the output light 70. Accordingly, the semiconductor laser device 101 can be used as a light source of an image application device and the like which are sensitive to a change of light intensity.

Note that the same advantage can be obtained even when the semiconductor laser device 101 does not have the optical waveguide 13 and the light from the semiconductor laser 12 is coupled with the diffraction grating 14 passing through the atmosphere or even when the diffraction grating 14 is directly connected to the emission end face of the semiconductor laser 12.

Figure 3:
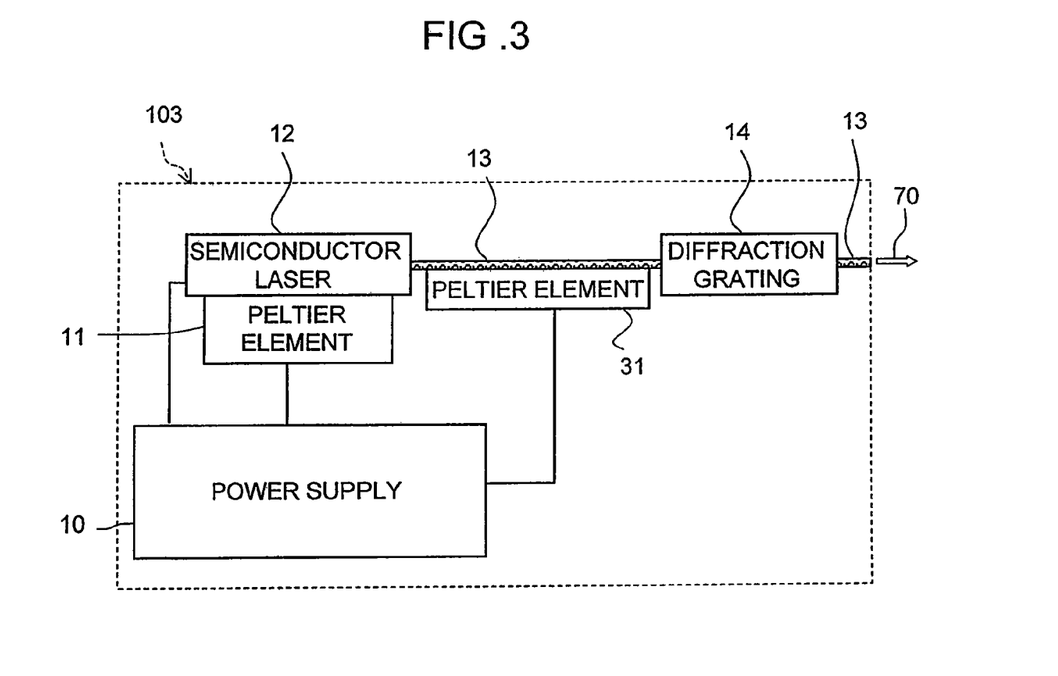
FIG. 3 is a block diagram showing an arrangement of a semiconductor laser device according to the present invention.

FIG. 3 is a block diagram showing an arrangement of a semiconductor laser device 103 of another embodiment. In FIG. 3, the same reference numerals as those used in FIG. 1 denote the same components. The semiconductor laser device 103 is different from the semiconductor laser device 101 of FIG. 1 in that the semiconductor laser device 103 includes a peltier element 31.

Although the peltier element 31 is the same device as the peltier element 11, it is connected to an optical waveguide 13. Although FIG. 3 describes that the peltier element 31 covers the optical waveguide 13, it may be in contact with the optical waveguide 13 or comes into contact therewith through a substrate of metal and the like. Further, the peltier element 31 is also supplied with a current including a sine wave from the peltier element drive unit of a power supply 10.

The semiconductor laser device 103 operates likewise the semiconductor laser device 101 of FIG. 1. Further, since the peltier element drive unit of the power supply 10 supplies the current including the sine wave, the temperature a cooling surface of the peltier element 31 is periodically varied, and the temperature of the optical waveguide 13 is also periodically varied. Accordingly, the longitudinal mode of the light traveling in the optical waveguide 13 is made to multi. Therefore, since the IL characteristics of the semiconductor laser device 103 are made as shown in FIG. 2, the semiconductor laser device 103 can obtain the same advantage as that of the semiconductor laser device 101 of FIG. 1.

Further, since the semiconductor laser device 103 makes the longitudinal mode of the light to the multi in the optical waveguide 13, the peltier element 11 may be controlled so that the semiconductor laser 12 has a constant temperature. Since the semiconductor laser 12 has the constant temperature, the wavelength of the light generated by the semiconductor laser 12 is stabilized.

Note that when the semiconductor laser device 103 does not have the optical waveguide 13 and the light from the semiconductor laser 12 is coupled with the diffraction grating 14 passing through the atmosphere or when the diffraction grating 14 is directly connected to the emission end face of the semiconductor laser 12, the same advantage can be obtained by applying a periodical temperature change by causing the peltier element to come into contact with an emission end face of the semiconductor laser 12 or to come into contact with an incident end face of the diffraction grating 14.

Figure 4:
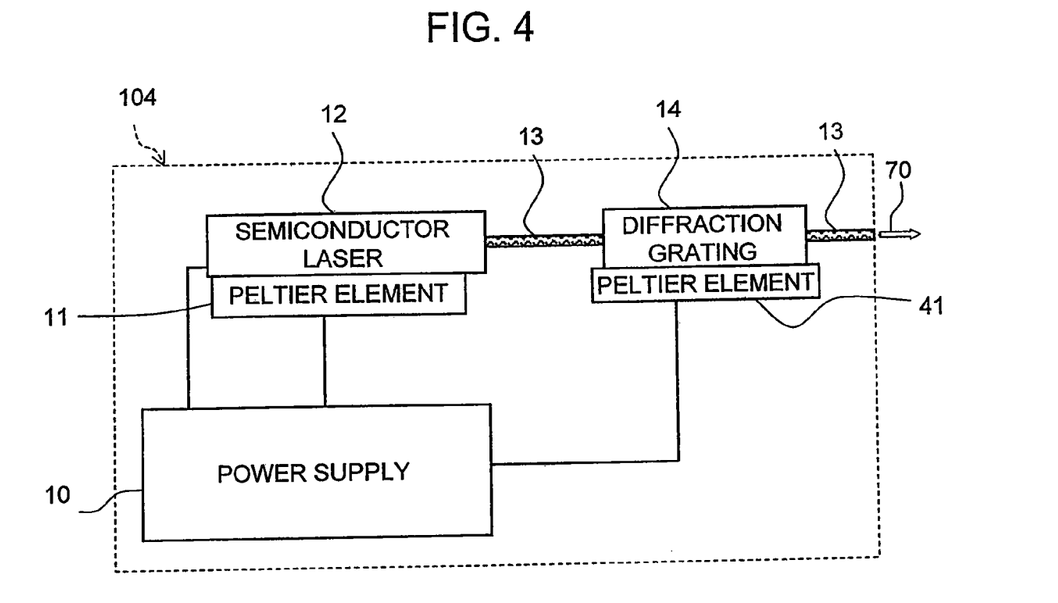
FIG. 4 is a block diagram showing an arrangement of a semiconductor laser device according to the present invention.

FIG. 4 a block diagram showing an arrangement of a semiconductor laser device 104 of an embodiment. In FIG. 4, the same reference numerals as those used in FIG. 1 denote the same components. The semiconductor laser device 104 is different from the semiconductor laser device 101 of FIG. 1 in that the semiconductor laser device 104 includes a peltier element 41.

Although the peltier element 41 is the same device as the peltier element 11, it is connected to a diffraction grating 14. Although the peltier element 41 may be in direct contact with the diffraction grating 14, it may come into contact therewith through a substrate of metal and the like. Further, the peltier element 41 is also supplied with a current including a sine wave from the peltier element drive unit of a power supply 10.

The longitudinal mode of the light reflected by the diffraction grating 14 is made to multi by applying a periodical temperature change to the diffraction grating 14 by the peltier element 41. Therefore, since the IL characteristics of the semiconductor laser device 104 are made as shown in FIG. 2, the semiconductor laser device 104 can obtain the same advantage as those of the semiconductor laser device 101 of FIG. 1 and the semiconductor laser device 103 of FIG. 3.

A future embodiment is directed to a semiconductor laser device having a semiconductor laser for generating light, a diffraction grating optically coupled with the semiconductor laser and reflecting a part of light having a predetermined wavelength of the light from the semiconductor laser to the semiconductor laser, an optical waveguide for optically coupling between the semiconductor laser and the diffraction grating, and vibration means for applying a periodical mechanical variation to the optical waveguide or the diffraction grating.

Further, the vibration means is a piezoelectric element connected to the optical waveguide or the diffraction grating.

Figure 5:
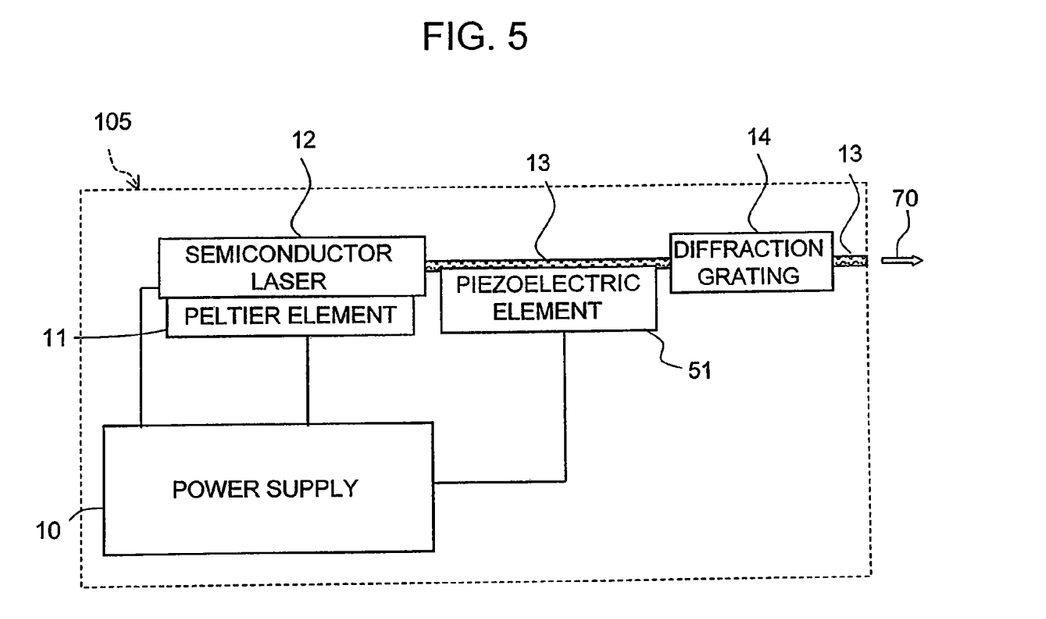
FIG. 5 is a block diagram showing an arrangement of a semiconductor laser device according to the present invention.

FIG. 5 is a block diagram showing an arrangement of a semiconductor laser device 105 of the embodiment. In FIG. 5, the same reference numerals as those used in FIG. 1 denote the same components. The semiconductor laser device 105 is different from the semiconductor laser device 101 of FIG. 1 in that the semiconductor laser device 105 includes the piezoelectric element 51 as the mechanical periodical fluctuation means and that a power supply 10 includes a piezoelectric element drive unit.

The piezoelectric element 51 is a piezoelectric element which are extended and contracted by a voltage fluctuation. The piezoelectric element 51 is connected to an optical waveguide 13. Further, the piezoelectric element 51 is electrically connected to the power supply 10 and supplied with a voltage having a ±V sin ωt sine wave as a periodical vibration. The piezoelectric element 51 is vibrated by the voltage in a sine wave as the periodical mechanical variation and transmits vibration to the optical waveguide 13.

A driving method of the semiconductor laser device 105, which optically couples the semiconductor laser 12 with the diffraction grating 14 through the optical waveguide 13 and generates light having the predetermined wavelength by reflecting a part of light having the predetermined wavelength of the light generated by the semiconductor laser 12 to the semiconductor laser 12 by the diffraction grating 14, has a feature in that the semiconductor laser device 105 outputs light while applying the periodical mechanical variation to the optical waveguide 13.

The semiconductor laser device 105 outputs output light 70 by operating as described in the semiconductor laser device 100 of FIG. 7. Further, since the piezoelectric element 51 applies vibration to the optical waveguide 13, the longitudinal mode of traveling light is made to multi. Therefore, the IL characteristics of the semiconductor laser device 105 are made as shown in FIG. 2, and the semiconductor laser device 105 can obtain the same advantage as that of the semiconductor laser device 101 of FIG. 1.

Further, since the semiconductor laser device 105 makes the longitudinal mode of light to multi by the optical waveguide 13, the wavelength of the light generated by the semiconductor laser 12 may be stabilized by controlling the peltier element 11 by the semiconductor laser 12 so that the semiconductor laser 12 has a constant temperature as explained in the semiconductor laser device 103 of FIG. 3.

Figure 6:
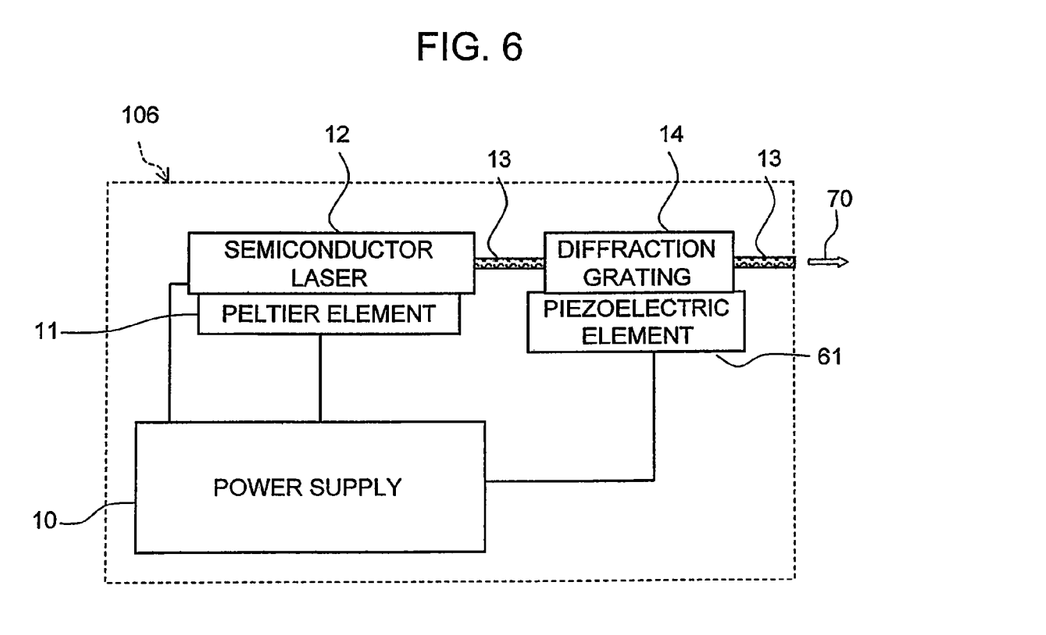
FIG. 6 is a block diagram showing an arrangement of a semiconductor laser device according to the present invention.

FIG. 6 is a block diagram showing an arrangement of a semiconductor laser device 106 of this embodiment. In FIG. 6, the same reference numerals as those used in FIGS. 1 and 5 denote the same components. The semiconductor laser device 106 is different from the semiconductor laser device 105 of FIG. 5 in that the semiconductor laser device 106 does not include the piezoelectric element 51 and includes a piezoelectric element 61.

Although the piezoelectric element 61 is the same device as the piezoelectric element 51, it is connected to a diffraction grating 14. A voltage having a sine wave is also applied to the piezoelectric element 61 from the piezoelectric element drive unit of a power supply 10 likewise the piezoelectric element 51.

The semiconductor laser device 106 operates likewise the semiconductor laser device 101 of FIG. 1. Further, the longitudinal mode of the light reflected by the diffraction grating 14 is made to multi by applying vibration to the diffraction grating 14 by the piezoelectric element 61. Therefore, since the IL characteristics of the semiconductor laser device 106 are made as shown in FIG. 2, the semiconductor laser device 106 can obtain the same advantage as those of the semiconductor laser device 101 of FIG. 1 and the semiconductor laser device 105 of FIG. 5.

Figure 9:
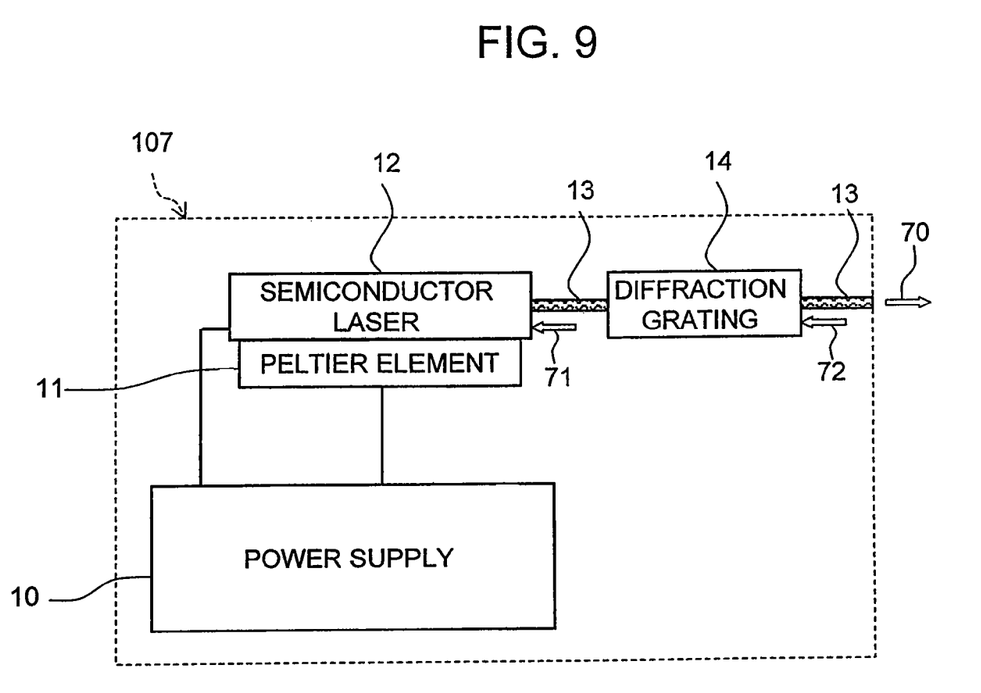
FIG. 9 is a block diagram showing an arrangement of a semiconductor laser device according to the present invention.

FIG. 9 is a block diagram showing an arrangement of a semiconductor laser device 107 of another embodiment. In FIG. 9, the same reference numerals as those used in FIG. 1 show the same components. The semiconductor laser device 107 is different from the semiconductor laser device 101 of FIG. 1 in that return light 71 whose intensity or wavelength periodically or non-periodically varies is incident on a portion of the semiconductor laser 12 from which light is emitted. The return light 71 may be created by return light control means (not shown) disposed externally of the semiconductor laser device 107. Further, the return light 71 may be caused to be incident from a output light side of the diffraction grating 14 as return light 72 by return light control means (not shown) disposed externally of the semiconductor laser device 107. The return light 72 travels in the optical waveguide 13 and is incident on a portion of the semiconductor laser 12 from which it emits light as the return light 71. For example, the return light control means is a light source which can change the intensity and the wavelength of light. The return light control means may be a reflection sheet that can change the intensity of light to be reflected. When the return light 71 is incident on the portion of the semiconductor laser 12 from which light is emitted, since the longitudinal mode of the semiconductor laser 12 makes multimode oscillation at all times, the semiconductor laser 12 can obtain the IL characteristics as shown in FIG. 2.

As described above, the semiconductor laser devices 101, 103, 104, 105, 106, and 107 can obtain IL characteristics in which a current is proportional to a light output. Note that the periodical fluctuation of the temperature and the vibration described above may be performed in the same degree as that of the response speed of a device which applies the fluctuation, and the temperature and the vibration may be varied non-periodically.

The driving method of the semiconductor laser device according to the present invention can be also applied to a gas laser, a liquid laser, and a solid state laser in addition to the semiconductor laser.

The invention claimed is:
1. A semiconductor laser device comprising:
 a semiconductor laser for generating light;
 a diffraction grating optically coupled with the semiconductor laser for reflecting a part of light having a predetermined wavelength of the light from the semiconductor laser to the semiconductor laser;
 an optical waveguide for optically coupling between the semiconductor laser and the diffraction grating; and
 a temperature control device applying a periodical fluctuation to the temperature of the semiconductor laser, the diffraction grating, or the optical waveguide, wherein the periodical fluctuation to the temperature makes the semiconductor laser device carry out a multimode oscillation and remove the kink of IL characteristics of which a longitudinal mode shifts from a single mode to a multimode, in order that the semiconductor laser carries out a multimode oscillation from a low output to a high output without shifting between a single mode oscillation and a multimode oscillation.

2. The semiconductor laser device according to claim 1, wherein the temperature control means is a peltier element connected to the semiconductor laser, the diffraction grating, or the optical waveguide for controlling the temperature of the semiconductor laser, the diffraction grating, or the optical waveguide.

3. The semiconductor laser device, characterized in that the periodical fluctuation of the temperature control in the semiconductor laser device according to claim 2 is in a sine wave state.

4. The semiconductor laser device, wherein the periodical fluctuation of the temperature control means in the semiconductor laser device according to claim 1 is in a sine wave state.

* * * * *